US008586974B2

(12) United States Patent
Yamazaki et al.

(10) Patent No.: US 8,586,974 B2
(45) Date of Patent: Nov. 19, 2013

(54) LIGHT-EMITTING DEVICE AND LIGHTING DEVICE

(75) Inventors: Shunpei Yamazaki, Tokyo (JP); Hisao Ikeda, Kanagawa (JP); Tomoe Matsubara, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 36 days.

(21) Appl. No.: 13/331,406

(22) Filed: Dec. 20, 2011

(65) Prior Publication Data

US 2012/0161115 A1 Jun. 28, 2012

(30) Foreign Application Priority Data

Dec. 24, 2010 (JP) .................................. 2010-287387

(51) Int. Cl.
*H01L 51/52* (2006.01)

(52) U.S. Cl.
USPC .......... 257/40; 257/59; 257/88; 257/E51.018; 313/500; 313/504; 313/506

(58) Field of Classification Search
USPC ........ 257/40, 59, 88, E51.018; 313/500, 504, 313/506
See application file for complete search history.

(56) References Cited

U.S. PATENT DOCUMENTS

| 5,369,289 | A | 11/1994 | Tamaki et al. |
| 5,421,908 | A | 6/1995 | Yoshida et al. |
| 5,905,275 | A | 5/1999 | Nunoue et al. |
| 6,320,633 | B1 | 11/2001 | Broer et al. |
| 6,433,487 | B1 | 8/2002 | Yamazaki |
| 6,479,941 | B1 | 11/2002 | Abe et al. |
| 6,525,467 | B1 | 2/2003 | Eida et al. |
| 6,566,808 | B1 | 5/2003 | Duggal et al. |
| 6,593,691 | B2 | 7/2003 | Nishi et al. |
| 6,630,785 | B1 | 10/2003 | Lu |
| 6,777,871 | B2 | 8/2004 | Duggal et al. |
| 6,781,162 | B2 | 8/2004 | Yamazaki et al. |
| 7,221,095 | B2 | 5/2007 | Yamazaki et al. |
| 7,427,834 | B2 * | 9/2008 | Yamazaki ..................... 313/506 |
| 7,733,441 | B2 | 6/2010 | Seo et al. |
| 2001/0035393 | A1 | 11/2001 | Lu et al. |
| 2003/0189401 | A1 | 10/2003 | Kido et al. |
| 2003/0222575 | A1 | 12/2003 | Yamazaki et al. |
| 2004/0227462 | A1 * | 11/2004 | Utsumi et al. ................ 313/506 |
| 2005/0258436 | A1 | 11/2005 | Arai |
| 2006/0119258 | A1 | 6/2006 | Sakata et al. |
| 2011/0050082 | A1 | 3/2011 | Inoue et al. |
| 2011/0284913 | A1 | 11/2011 | Ibe et al. |

FOREIGN PATENT DOCUMENTS

| JP | 10-172767 | 6/1998 |
| JP | 2009-140817 | 6/2009 |
| JP | 2010-182677 | 8/2010 |

\* cited by examiner

*Primary Examiner* — Thinh T Nguyen
(74) *Attorney, Agent, or Firm* — Husch Blackwell LLP

(57) ABSTRACT

A light-emitting device including a reflection member, a sealing member having a light-transmitting property, and a light-emitting element between the reflection member and the sealing member is provided. In the light-emitting device, the light-emitting element includes a first transparent electrode; a second transparent electrode; and an EL layer between the first transparent electrode and the second transparent electrode, the reflection member includes a reflective electrode having projections and an electric resistance lower than an electric resistance of the first transparent electrode; and a planarization film covering the reflective electrode, a through hole that reaches the reflective electrode is formed in the planarization film, and the reflective electrode is electrically connected to the first transparent electrode.

26 Claims, 16 Drawing Sheets

LIGHT-EMITTING DEVICE AND LIGHTING DEVICE

BACKGROUND OF THE INVENTION

1. Field of the Invention

The present invention relates to a light-emitting element in which a light-emitting layer containing an organic compound is interposed between a pair of electrodes, and a light-emitting device or a lighting device including the light-emitting device. The present invention also relates to a manufacturing method of the light-emitting element.

2. Description of the Related Art

In recent years, a light-emitting element (also referred to as an electroluminescent (EL) element) in which a light-emitting layer (hereinafter also referred to as an EL layer) containing an organic compound is interposed between a pair of electrodes has been actively developed. Lighting has attracted attention as one of application fields of the light-emitting element. This is because a lighting device including the EL element has features different from those of other lighting devices; for example, the lighting device including the EL element can be thin and light, and perform surface emission.

As described above, an EL element has a structure in which a light-emitting layer containing an organic compound is interposed between a pair of electrodes. Thus, emission from the light-emitting layer is extracted through at least one of the pair of electrodes. Accordingly, in general, at least one of the pair of electrodes in the EL element is formed using a conductive film having a property of transmitting visible light (a transparent conductive film).

However, the resistivity of a transparent conductive film is one or two orders of magnitude higher than that of metal which easily conducts electricity. In particular, in a large-area element that is used for a lighting purpose or the like, there is a problem in that variation in luminance of a light-emitting surface of the light-emitting element due to voltage drop is significant. Therefore, Patent Document 1 suggests that a metal layer formed using a substance whose resistance is lower than that of the transparent conductive film is provided between the transparent conductive film and the light-emitting layer containing an organic compound (see Patent Document 1).

Another problem caused by the use of a transparent conductive film is about light extraction efficiency. In an organic EL element, light is emitted in all directions from a light-emitting layer. Therefore, total reflection occurs at an interface between layers whose refractive indexes are different from each other, so that much light is confined in a light-emitting element. The confined light is reabsorbed every reflection and thus attenuated, whereby the light almost disappears. Since a transparent conductive film has a higher refractive index than an organic compound, it is said that in a light-emitting element that is not devised to improve the light extraction efficiency, half or more of light is not extracted and disappears. In view of the above, various measures to improve the light extraction efficiency of an organic EL element have been taken (see Patent Document 2).

REFERENCE

[Patent Document 1] Japanese Published Patent Application No. 2009-140817
[Patent Document 2] Japanese Published Patent Application No. 2010-182677

SUMMARY OF THE INVENTION

Although such lighting devices including an organic EL element have features which the existing lighting devices do not have, in order to obtain a competitive edge in the mature lighting device market, a countermeasure in terms of cost is needed in addition to high quality and preferable emission efficiency of the lighting devices.

In viewing of the above, it is an object of the present invention to provide a light-emitting device or a lighting device that can be manufactured to have less variation in luminance of a light-emitting surface and high emission efficiency without great increase in cost.

The present invention aims to achieve at least one of the above-described objects.

In view of the above, the present inventors found a structure in which a light-emitting element is provided between a sealing member having a light-transmitting property and a reflection member provided with a reflective electrode having projections and conductivity, and the reflective electrode having conductivity is used as an auxiliary electrode. That is, one embodiment of the present invention is a light-emitting device including a reflection member, a sealing member having a light-transmitting property, and a light-emitting element between the reflection member and the sealing member. In the light-emitting device, the light-emitting element includes a first transparent electrode; a second transparent electrode; and an EL layer between the first transparent electrode and the second transparent electrode, the reflection member includes a reflective electrode having projections and an electric resistance lower than an electric resistance of the first transparent electrode; and a planarization film covering the reflective electrode, and the reflective electrode is electrically connected to the first transparent electrode.

In the light-emitting device with the above-described structure, of light emitted in all directions, part of light which cannot be conventionally extracted to the outside of the light-emitting device due to total reflection or the like, can be extracted by changing the angle of reflection with use of the reflection member provided with the reflective electrode having projections, whereby the emission efficiency of the light-emitting device can be improved. Further, since the first transparent electrode is electrically connected to the reflective electrode having a lower electric resistance than the first transparent electrode, the reflective electrode can compensate the low conductivity of the first transparent electrode, whereby the variation in luminance of a light-emitting surface can be suppressed. Furthermore, the reflective electrode has a function as an auxiliary electrode, that is, an auxiliary electrode is formed entirely over the whole light-emitting region; therefore, voltage drop of the first electrode can be suppressed more efficiently. Since the reflective electrode serves as an auxiliary electrode, the effects described above can be achieved without great increase in cost or number of manufacturing steps.

Another embodiment of the present invention is a light-emitting device with the above structure, in which an insulating layer over the through hole is formed between the second transparent electrode and the EL layer.

The above-described structure of the light-emitting device is preferable because the reliability is improved.

Another embodiment of the present invention is a light-emitting device with the above structure, in which the second transparent electrode is not formed in a portion overlapping with the through hole.

The above-described structure of the light-emitting device is preferable because the reliability is improved.

Another embodiment of the present invention is a light-emitting device with the above structure, in which the planarization film includes a conductive organic resin.

The above-described structure of the light-emitting device is preferable because the manufacturing process can be simplified.

Another embodiment of the present invention is a light-emitting device with the above structure, in which the refractive index of the planarization film is 1.6 to 2.0.

The above-described structure of the light-emitting device is preferable because more light can reach the reflection member.

Another embodiment of the present invention is a light-emitting device with the above structure, in which the reflection member has a stack of an insulating substrate and a reflective electrode having conductivity, the insulating substrate includes a projection, and a shape of a projection of the reflective electrode is in accordance with a shape of the projection of the insulating substrate.

In the light-emitting device with the above-described structure, projections of the reflection member can be formed by processing the insulating substrate, whereby the projections can be formed easily. Further, the amount of the conductive material can be reduced, so that the weight of the light-emitting device can be reduced.

Another embodiment of the present invention is a light-emitting device with the above structure, in which the reflection member has a stack of an insulating substrate and a reflective electrode having conductivity, the insulating substrate is flat, and the reflective electrode includes a projection.

In the light-emitting device with the above-described structure, formation of the projections of the reflection member is easily controlled.

Another embodiment of the present invention is a light-emitting device with the above structure, in which a material included in the reflective member is a metal selected from silver, aluminum, gold, nickel, platinum, tin, copper, magnesium, and palladium; a compound comprising the metal; an alloy comprising the metal; or a stainless steel comprising the metal.

Another embodiment of the present invention is a light-emitting device with the above structure, in which an average height Rc of a roughness curvilinear element of each of the projections of the reflection member is greater than or equal to 0.01 μm and less than or equal to 100 μm, preferably greater than or equal to 0.1 μm and less than or equal to 100 μm, and a distance between tops of the two adjacent projections of the reflection member is greater than or equal to 0.1 μm and less than or equal to 100 μm.

Another embodiment of the present invention is a lighting device including the light-emitting device with the above structure.

One embodiment of the present invention can provide a light-emitting device or a lighting device that can be manufactured to have less variation in luminance of a light-emitting surface and preferable emission efficiency without great increase in cost.

DETAILED DESCRIPTION OF THE INVENTION

Figure 1A:
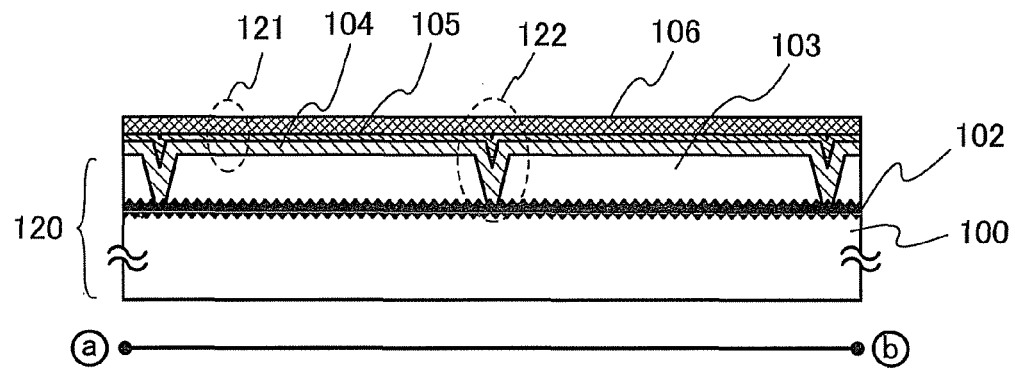
FIGS. 1A and 1B are views illustrating a light-emitting device which is one embodiment of the present invention.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments.

Note that for easy understanding, the magnification ratio and the reduction ratio of each component in drawings is not constant, and thus the relationship of thickness, length, and size of each component in the drawings does not necessarily show the ratios of thickness, length, and size of a lighting device which is one embodiment of the present invention.

Embodiment 1

Figure 1B:
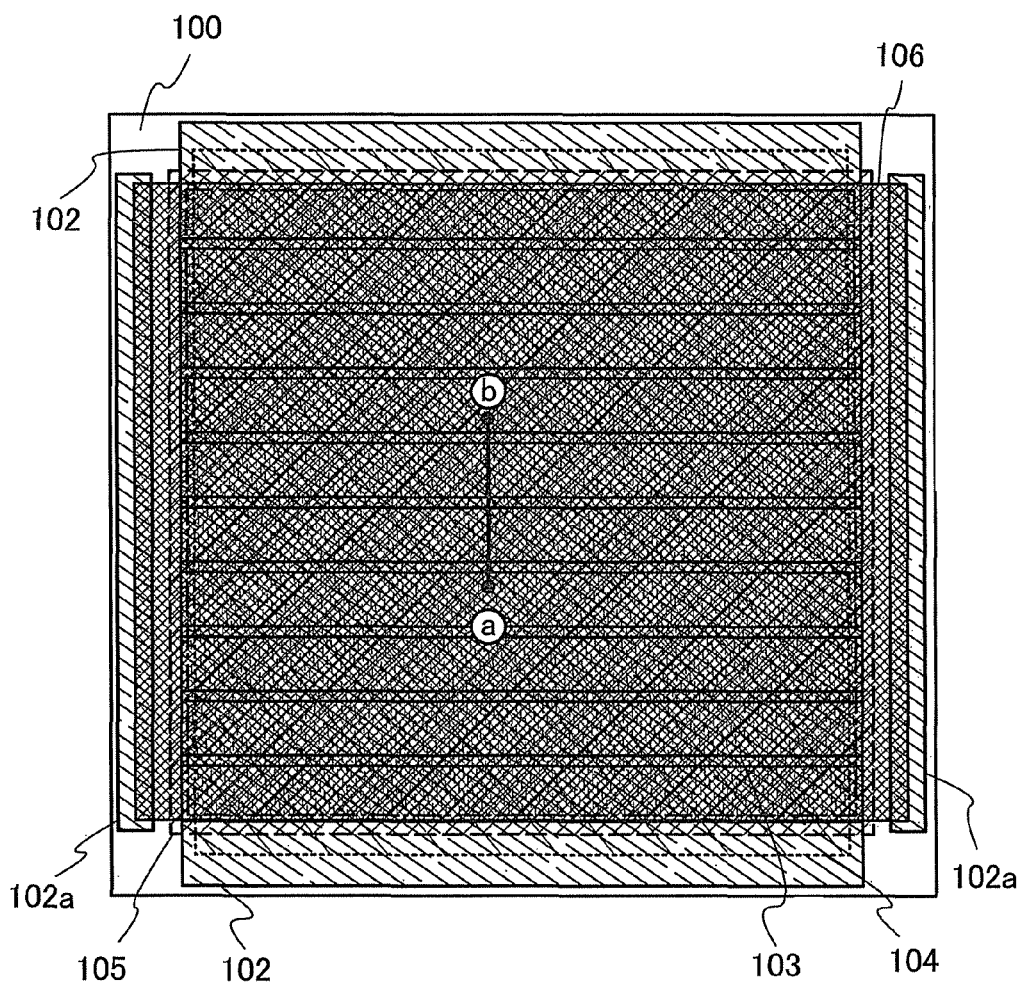

FIGS. 1A and 1B are a schematic cross-sectional view and a schematic top view illustrating a light-emitting device which is one embodiment of the present invention. FIG. 1A is an enlarged view of a cross section taken along line a-b in FIG. 1B. In FIGS. 1A and 1B, a reflective electrode 102 is formed in contact with an uneven surface of a support 100 having projections, and a planarization film 103 is formed to cover the reflective electrode 102, so that a reflection member 120 is formed. Although a surface of the reflective electrode 102 is provided with projections in accordance with the projections of the support 100, the projections of the reflective electrode 102 is covered with the planarization film 103, so that projections of the reflection member 120 are lessened.

A light-emitting element 121 including a first transparent electrode 104, an EL layer 105, and a second transparent electrode 106 is formed over the reflection member 120. Since the light-emitting element 121 is formed on the reflection member 120 whose projections on the surface are lessened, occurrence of defects (such as a short circuit or abnormal luminance of a light-emitting surface) due to the projections on the surface of the reflective electrode 102 can be suppressed.

A through hole 122 that reaches the reflective electrode 102 is formed in the planarization film 103. The first transparent electrode 104 and the reflective electrode 102 are electrically connected to each other through the through hole 122. Note that in this specification, the expression being "electrically connected" includes the case where two objects, e.g., the first transparent electrode 104 and the reflective electrode 102, are electrically connected indirectly as well as the case where the two objects, e.g., the first transparent electrode 104 and the reflective electrode 102 are electrically connected directly. For example, in the case where a substance having a higher conductivity than the first transparent electrode 104 exists between the reflective electrode 102 and the first transparent electrode 104, it is needless to say that the reflective electrode 102 and the first transparent electrode 104 are electrically connected to each other. Further, even in the case where a very thin oxide film having an insulating property is formed on a surface of the reflective electrode 102 or the case where a substance having a lower conductivity than the first transparent electrode 104 exists between the reflective electrode 102 and the first transparent electrode 104, the reflective electrode 102 and the first transparent electrode 104 are electrically connected to each other as long as the presence of the oxide film or the substance can be substantially ignored in terms of thickness and the like.

The thickness, material, and the like of the reflective electrode 102 are selected so that the reflective electrode 102 has a lower electric resistance than the first transparent electrode 104. A material with a high reflectance of visible light is used for the reflective electrode 102.

In the light-emitting element 121 of the light-emitting device with the above structure, light emitted toward the reflection member 120 is reflected by the projections of the reflection member 120 and thus an angle of the light is changed. Accordingly, part of light that repeats reflection and is attenuated inside the light-emitting element 121 in the case where the reflection surface is flat, can be extracted to the outside of the light-emitting device. As the result, light extraction efficiency is improved and external quantum efficiency of the light-emitting element can be improved, whereby a light-emitting device with high emission efficiency can be provided.

Further, with the structure in which the reflective electrode 102 is electrically connected to the first transparent electrode 104 and has a lower electric resistance than the first transparent electrode 104, the reflective electrode 102 can be used as an auxiliary wiring of the first transparent electrode 104. Accordingly, luminance unevenness in the light-emitting element 121 which is caused by voltage drop due to a high electric resistance of the first transparent electrode 104 can be prevented from being caused. The electric resistance of the reflective electrode 102 is preferably less than or equal to one-tenth of the electric resistance of the first transparent electrode 104 in terms of effect of suppressing voltage drop.

The reflection member 120 and the light-emitting element 121 with the above structures are blocked from an external atmosphere with the use of a sealing member (not shown). In this manner, a light-emitting device can be manufactured. The light-emitting device may be further provided with an integrated circuit equipped with a converter or the like, an external input terminal, or the like. Reference numeral 102a denotes an external input terminal. FIG. 1B illustrates an example where the external input terminal 102a is formed simultaneously with the formation of the reflective electrode 102.

Here, the reflection member 120 is described in detail. The reflection member 120 includes the support 100, the reflective electrode 102, and the planarization film 103. The reflective electrode 102 has projections on its surface, which changes an angle of light reflected by the reflective electrode 102. The size of the projection is as follows: the average height Rc of the roughness curvilinear element in the surface having the projections is greater than or equal to 0.01 μm and less than or equal to 1000 μm; and a distance between tops of adjacent projections is greater than or equal to 0.1 μm and less than or equal to 1000 μm. In order to scatter light efficiently, it is preferable that the average height Rc of the roughness curvilinear element in the surface of the projections be greater than or equal to 0.1 μm and less than or equal to 100 μm; and the distance between tops of adjacent projections be greater than or equal to 0.1 μm and less than or equal to 100 μm.

The shape of the projection may be a hemisphere or a pyramid, and the bottom shapes of the projections may be regular or irregular. In the case where the bottom shapes of the projections are regular, although the shape may be a circle or a polygon, a triangle, a rectangle, or a hexagon is preferable because it is capable of tessellation, and a regular hexagon is further preferable. In the case where the projections are formed regularly, a preferable shape of the projection is that the bottom shape of the projection is a hexagon and the cross-sectional shape in the vertical direction is a hemisphere. Note that in the case where the shapes of the projections are random, influence of interference of light can be suppressed to easily provide uniform light, which is preferable.

Any material may be used for the support 100 as long as it can support the light-emitting element 121. For example, a glass substrate, a quartz substrate, a substrate or a film formed of an organic resin, a ceramic substrate, a metal substrate, or the like can be used. Examples of the organic resin include an acrylic resin, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. The support 100 may be provided with a protection film, a reinforcing member, or a member for keeping an insulating property on its surface (in the case where a conductive substrate such as a metal substrate is used as the support 100).

In the structure in FIGS. 1A and 1B, projections are provided on a surface of the support 100. Etching or blasting may be performed for forming the projections. In the case where the material for the support 100 is an organic resin, a printing method such as screen printing or offset printing, a droplet discharge method such as a dispenser method or an ink jet method, a dipping method, an imprint method, or the other known method can be employed as appropriate.

The reflective electrode 102 may be formed with a material having a high reflectance of visible light and a certain degree of conductivity. The reflective electrode 102 can have a function as an auxiliary electrode as long as the reflective electrode 102 has a lower electric resistance than the first transparent electrode. The electric resistance is determined by resistivity and a cross-section area, and thus is not particularly limited to the conductivity and the resistivity of the material itself.

Examples of a material which can be used for the reflective electrode 102 include silver, aluminum, gold, nickel, platinum, tin, copper, magnesium, palladium, a compound including at least one of these elements, an alloy including at least one of these elements, stainless steel including at least one of these elements, and the like.

In the structure in FIGS. 1A and 1B, a material of the reflective electrode 102 is deposited on the support 100 having projections, so that the reflective electrode 102 having projections on its surface in accordance with the projections of the support 100 can be formed. As a method for forming the reflective electrode 102, as well as an evaporation method such as a vacuum evaporation method, a sputtering method, an ion plating method, or a CVD method, a known method may be used: for example, a spin coating method, a dipping method, a spray method, a coater method such as gravure coater, or blade coater, a printing method such as a screen printing, an electroless plating method, or an electroplating method may be used.

Figure 11:
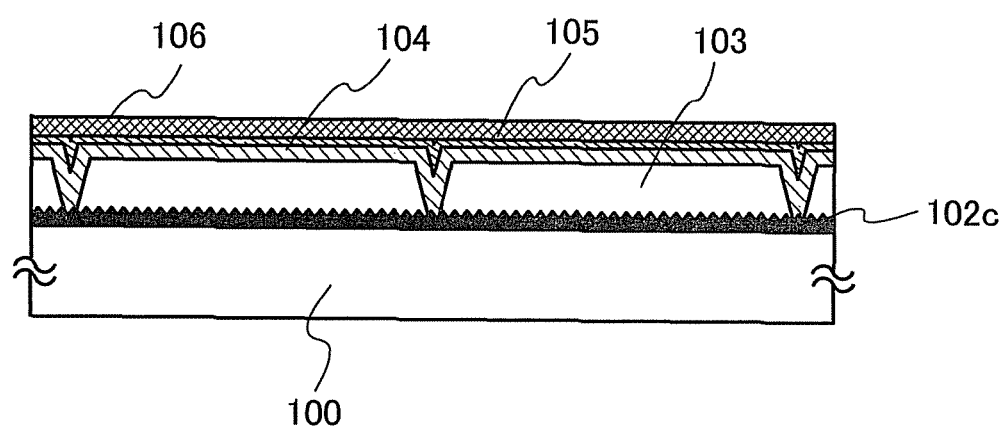
FIG. 11 is a view illustrating a light-emitting device which is one embodiment of the present invention.

As another structure, projections may be formed as in FIG. 11 in the following manner: a support 100 without projections is used, a reflective electrode 102c is formed thereover, and then a surface of the reflective electrode 102c is processed to have projections. A known surface processing technique such as etching or blasting may be performed for forming the projections.

Figure 12:
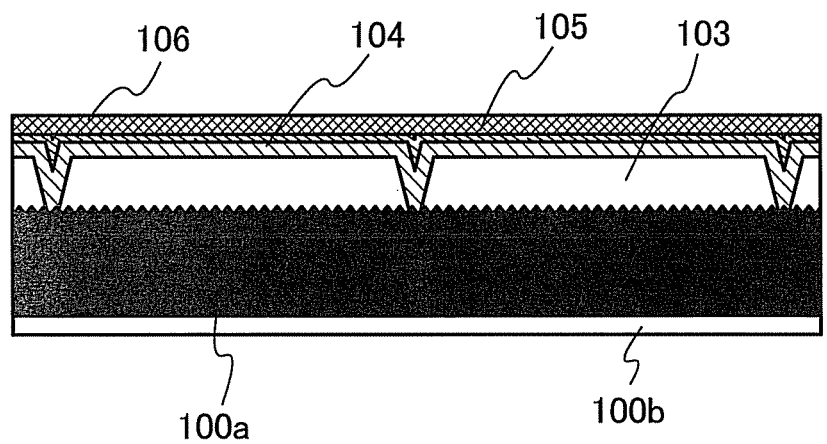
FIG. 12 is a view illustrating a light-emitting device which is one embodiment of the present invention.

In the case where a conductive and highly reflective substrate, such as a metal substrate typified by a stainless steel substrate is used as the support 100 as in FIG. 12, a support 100a may have a function as the support 100 and a function as the reflective electrode 102. In that case, a surface of a light-emitting device or a lighting device is also conductive, and therefore, an insulating protection film 100b may be provided as appropriate.

The planarization film 103 is formed in order to reduce adversely effect on the light-emitting element 121 such as a short circuit or leakage by planarizing the uneven surface of the reflective electrode 102. The planarization film 103 may have a thickness at least large enough to cover a portion in which a difference between the bottom of a projection and the top of the projection is the largest. When it is difficult to detect the portion, the thickness of the planarization film 103 may be twice or more as large as the average height Rc of the roughness curvilinear element of the projections in the reflection member.

As a material that can be used for the planarization film 103, polyimide, polyamide, polyimide amide, acrylic, benzocyclobutene (BCB), and the like are given. Further, in the case where a transparent conductive material with a high refractive index such as ITO is used for the first transparent electrode, it is effective to use a material with, a high refractive index for the planarization film 103 in order that more light reaches the reflective electrode 102. As examples of resins with a high refractive index, in addition to polyethylene terephthalate (PET), triacetyl cellulose (TAC), and the like, resins containing bromine or sulfur such as a sulfur-containing polyimide resin, an episulfide resin, a thiourethane resin, and a brominated aromatic resin; and a resin in which micrograins of titanium oxide or zirconia oxide are diffused are given. The preferable refractive index of the resin with a high refractive index is about 1.6 to 2.0.

The planarization film 103 may be formed by a spin coating method, a dipping method, a spray method, a coater method such as gravure coater or blade coater, a printing method such as screen printing; or the like.

The through hole 122 that reaches the reflective electrode 102 is formed in the planarization film 103. The through hole 122 may be formed by a method in which the planarization film is formed entirely over the surface of the reflective electrode 102, and then a portion corresponding to the hole 122 is removed. Alternatively, the through hole 122 may be formed by a method in which a material layer of the planarization film 103 is prevented from being formed in the portion corresponding to the through hole 122 with use of a shadow mask, by a printing method, or the like.

FIGS. 1A and 1B illustrate the through hole 122 having a slit shape. As in FIGS. 1A and 1B, the planarization film 103 may be divided into a plurality of island-shaped planarization films by the through holes 122.

Figure 6A:
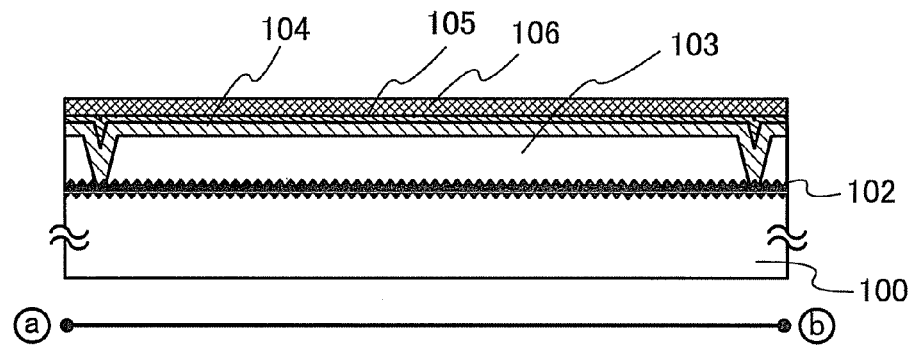
FIGS. 6A and 6B are views illustrating a light-emitting device which is one embodiment of the present invention.
Figure 6B:
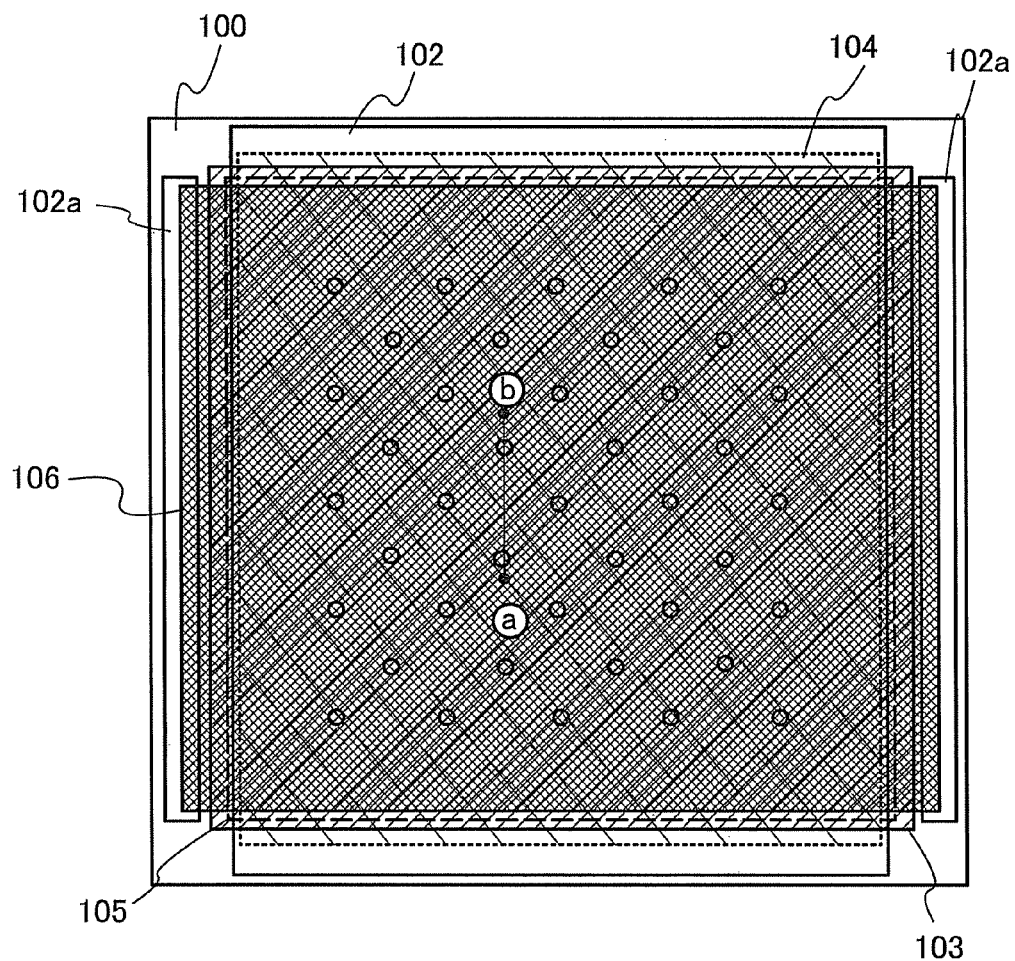
Figure 7A:
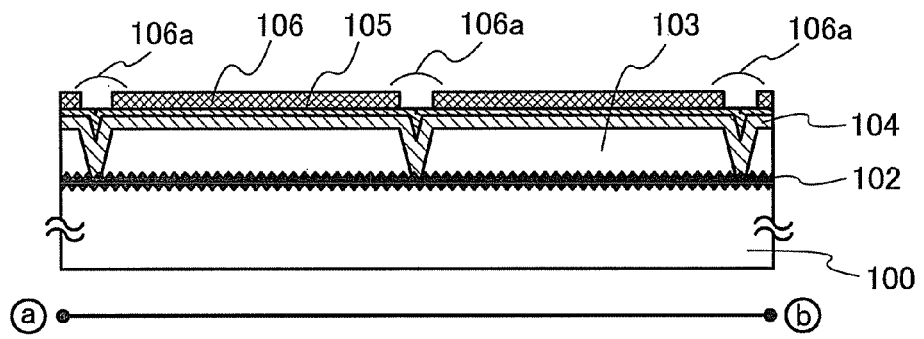
FIGS. 7A and 7B are views illustrating a light-emitting device which is one embodiment of the present invention.
Figure 7B:
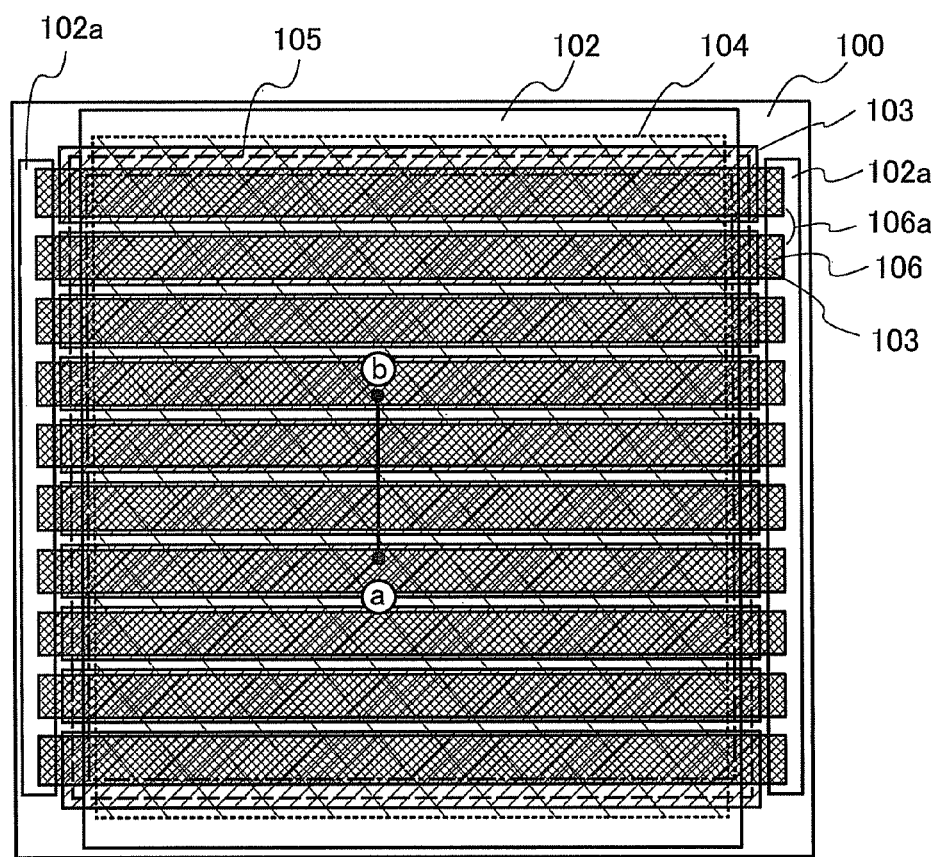
Figure 8A:
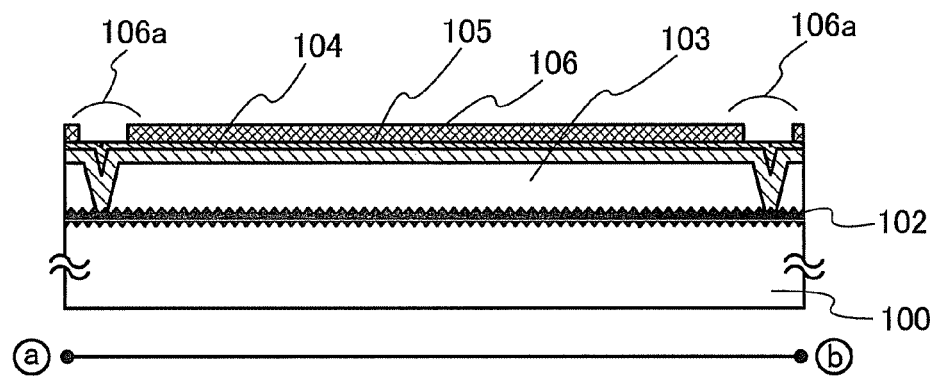
FIGS. 8A and 8B are views illustrating a light-emitting device which is one embodiment of the present invention.
Figure 8B:
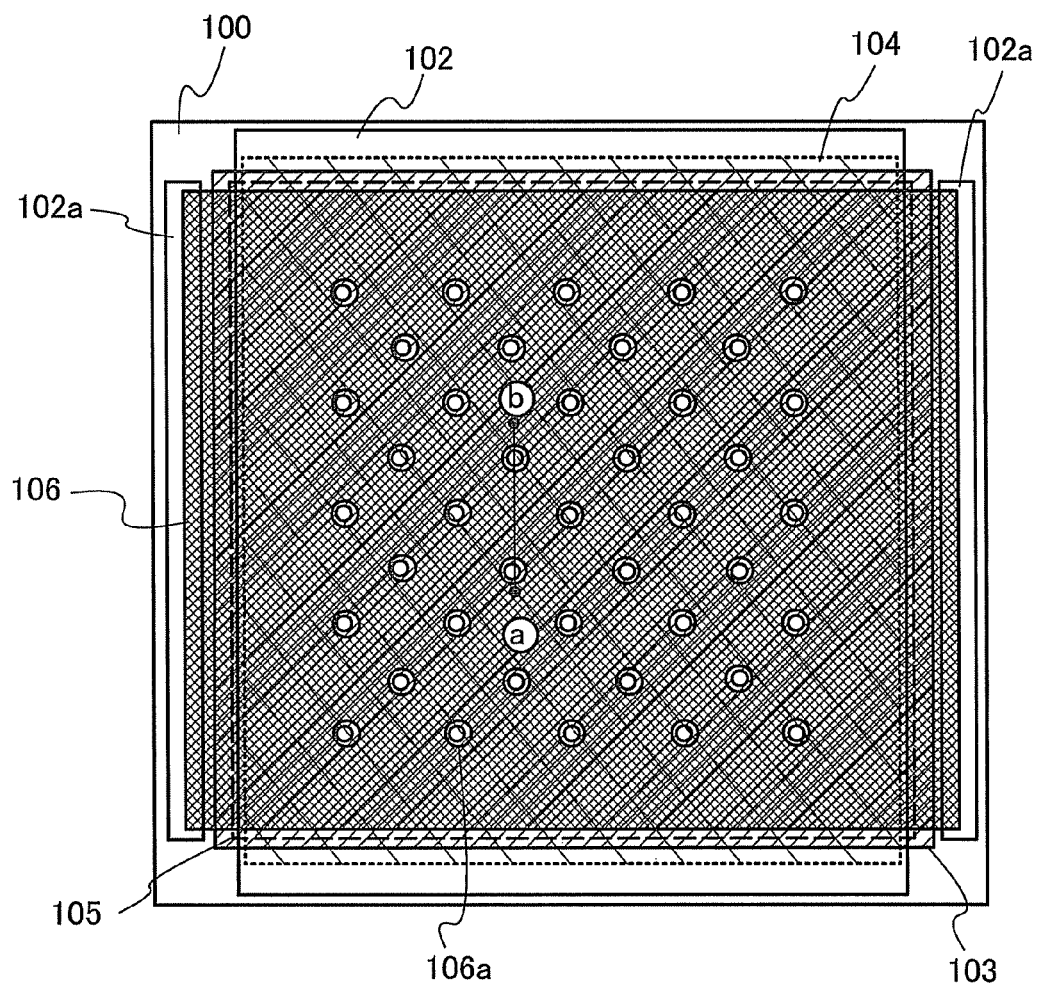

FIGS. 6A and 6B illustrate the through hole 122 having a dot shape. In the light-emitting device or the lighting device in this embodiment, the reflective electrode 102 formed entirely over the emission region is used as an auxiliary electrode, and compensates the voltage through the through hole 122. In this manner, even with a structure in which the through holes 122 are dispersed, luminance unevenness in the emission region can be effectively suppressed. Accordingly, an area of an effective emission region can be increased, which leads to reduction in power consumption.

Note that the shape of the through hole 122 is not limited to the above-described shapes, and the shape and size of the through hole 122, the interval between the through holes 122, and the like may be determined as appropriate so as to achieve the allowable light-emitting quality in consideration of variation in emission luminance of light-emitting elements due to voltage drop of the first transparent electrode 104.

Figure 10:
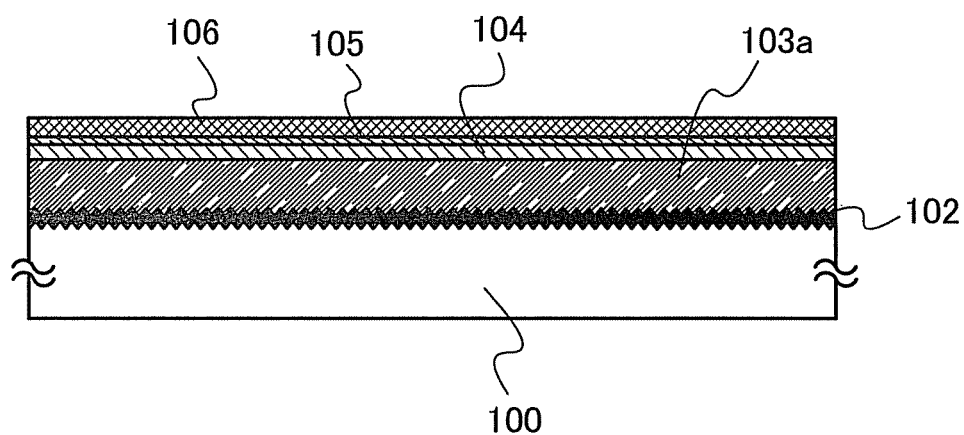
FIG. 10 is a view illustrating a light-emitting device which is one embodiment of the present invention.

With another structure where a conductive polymer is used for the planarization film 103a as in FIG. 10, adversely effect by voltage drop of the first transparent electrode 104 can be reduced and occurrence of uneven emission can be suppressed. As the conductive polymer, a substance with higher transparence can be selected among π-electron conjugated conductive polymers such as polyaniline and/or a derivative thereof, polypyrrole and/or a derivative thereof, polythiophene and/or a derivative thereof, and a copolymer of two or more kinds of those materials, for example.

The first transparent electrode 104 formed using a transparent conductive film is formed over the support 100. As the transparent conductive film, indium oxide ($In_2O_3$), indium tin oxide ($In_2O_3$—$SnO_2$: also referred to as ITO), indium zinc oxide ($In_2O_3$—ZnO), zinc oxide (ZnO), zinc oxide to which gallium is added, or the like can be used. Films of these conductive metal oxides are usually formed by sputtering; however, a sol-gel method or the like may be used. Alternatively, as the first transparent electrode 104, a thin transparent conductive film formed using gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), or the like to have a sufficient light-transmitting property can be used. The above-described materials have a high work function (specifically 4.0 eV or higher) and thus are preferably used in the case where the first transparent electrode 104 is an anode.

Note that with use of a composite material described later for a surface of the EL layer 105 which is in contact with the first transparent electrode 104, an electrode material can be selected regardless of its work function.

In the case where the first transparent electrode 104 is a cathode, a material having a low work function (specifically 3.8 eV or lower), specifically a metal element belonging to Group 1 or 2 of the periodic table, that is, an alkali metal such as lithium (Li) or cesium (Cs), an alkaline earth metal such as magnesium (Mg), calcium (Ca), or strontium (Sr), or an alloy containing any of these elements (e.g., MgAg or AlLi), a rare earth metal such as europium (Eu) or ytterbium (Yb), an alloy containing any of these elements, aluminum (Al), an alloy containing aluminum, or the like can be used. A thin film formed using any of these materials to have a sufficient light-transmitting property as the transparent conductive film can also be used as the first transparent electrode 104.

Note that an alkali metal, an alkaline earth metal, or a compound thereof is used for the surface of the EL layer 105 which is in contact with the first transparent electrode, or an electron-transport substance to which a substance exhibiting an electron-donating property to the electron-transport substance (hereinafter referred to as a material having a donor level) is used for the electron-transport substance, whereby the electrode material can be selected regardless of its work function. In other words, an oxide transparent conductive film typified by ITO can be used as a material of a cathode. With use of a charge-generation layer formed by stacking a layer formed using a composite material and a layer formed using the material having a donor level, the same effect can be obtained. Note that in that case, the layer formed using the composite material is in contact with the first transparent electrode 104.

Alternatively, a conductive polymer having a light-transmitting property can be used for the first transparent electrode 104. For example, as the conductive polymer, a π-electron conjugated conductive polymer such as polyaniline and/or a derivative thereof, polypyrrole and/or a derivative thereof, polythiophene and/or a derivative thereof, or a copolymer of two or more kinds of these materials can be used.

The first transparent electrode 104 can be formed by a known method, for example, a sputtering method, a vacuum evaporation method, an ion plating method, a molecular beam epitaxy (MBE) method, a CVD method (a metal organic CVD (MOCVD) method or an atomic layer deposition (ALD) method), a sol-gel method, a spin coating method, a dipping method, a spray method, a coater method, or a printing method, depending on a material used for the first transparent electrode 104.

FIG. 1B shows an example where the first transparent electrode 104 forms an island shape, which is one favorable example in terms of light-emitting area or suppression of voltage drop. The first transparent electrode 104 may be divided into a plurality of island-shaped first transparent electrodes depending on the purpose or convenience.

The EL layer 105 is formed to cover the first transparent electrode 104 and the through holes 122. There is no particular limitation on the stacked structure of the EL layer 105. The EL layer 105 may be formed by combining functional layers as appropriate, such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided. Note that such a stacked structure is also referred to as a light-emitting unit in some cases.

Figure 2:
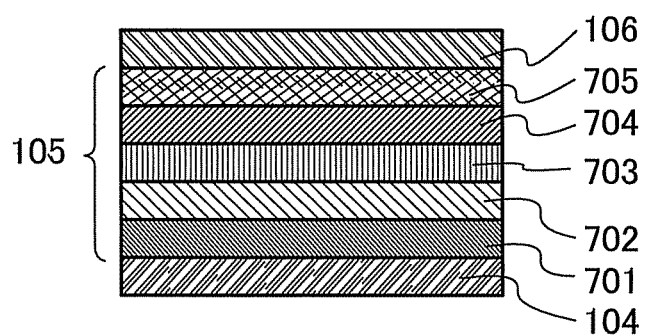
FIG. 2 is a diagram illustrating a structural example of an EL layer applicable to the present invention.

In this embodiment, a structure of the EL layer 105 which includes a hole-injection layer 701, a hole-transport layer 702, a light-emitting layer 703, an electron-transport layer 704, and an electron-injection layer 705 is described (see FIG. 2). A structure and material of each layer is described below in detail.

The hole-injection layer 701 is a layer which is provided in contact with an anode and contains a substance having a high hole-injection property. The hole-injection layer 701 can be formed using molybdenum oxide, vanadium oxide, ruthenium oxide, tungsten oxide, manganese oxide, or the like. Alternatively, the hole-injection layer 701 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecule such as poly(ethylenedioxythiophene)/poly(styrenesulfonic acid) (PEDOT/PSS); or the like.

Alternatively, the hole-injection layer 701 can be formed using a composite material in which a substance exhibiting an acceptor property with respect to a substance having a high hole-transport property is contained in the substance having a high hole-transport property. Note that when a layer of the composite material in which an acceptor substance is contained in a substance having a high hole-transport property is formed in contact with the anode, a material for forming the anode can be selected regardless of its work function. In other words, besides a material with a high work function, a material with a low work function may also be used for the anode. As the acceptor substance, 7,7,8,8-tetracyano-2,3,5,6-tetrafluoroquinodimethane (abbreviation: $F_4$-TCNQ), chloranil, and the like are given. In addition, a transition metal oxide is given. Moreover, oxides of metals that belong to Group 4 to Group 8 of the periodic table are given. Specifically, vanadium oxide, niobium oxide, tantalum oxide, chromium oxide, molybdenum oxide, tungsten oxide, manganese oxide, and rhenium oxide are preferable because their electron-accepting property is high. In particular, molybdenum oxide is preferable because of its stability in the atmosphere, a low hygroscopic property, and easiness in handling.

As the substance having a high hole-transport property used for the composite material, any of a variety of compounds such as an aromatic amine compound, a carbazole derivative, an aromatic hydrocarbon, and a high molecular compound (e.g., an oligomer, a dendrimer, or a polymer) can be used. The organic compound used for the composite material is preferably an organic compound having a high hole-transport property. Specifically, a substance having a hole mobility of $10^{-6}$ cm$^2$/Vs or higher is preferably used. However, another substance may be used instead of the above described materials as long as the substance has a hole-transport property higher than an electron-transport property. The organic compounds that can be used for the composite material are specifically given below.

As the aromatic amine compounds, for example, there are N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), and 1,3,5-tris[N-(4-diphenylaminophenyl)-N-phenylamino]benzene (abbreviation: DPA3B).

As the carbazole derivatives which can be used for the composite material, the followings are given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Other examples of the carbazole derivatives which can be used for the composite material include 4,4'-di(N-carbazolyl)

biphenyl (abbreviation: CBP), 1,3,5-tris[4-(N-carbazolyl) phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene, and 2,5,8,11-tetra(tert-butyl)perylene. Besides those, pentacene, coronene, or the like can be used. In particular, the aromatic hydrocarbon which has a hole mobility of $1\times10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, 4,4'-bis(2,2-diphenylvinyl)biphenyl (abbreviation: DPVBi) and 9,10-bis[4-(2,2-diphenylvinyl)phenyl]anthracene (abbreviation: DPVPA) are given, for example.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N-bis(4-butylphenyl)-N,N-bis(phenyl)benzidine (abbreviation: Poly-TPD) can also be used.

Note that a layer formed using such a composite material can be very suitably used for optical design that is performed to control the light extraction efficiency, directivity, or the like of light emitted from the light-emitting layer because the driving voltage of the layer formed using the composite material hardly varies even when the layer is formed to be thick or thin.

The hole-transport layer 702 is a layer which contains a substance having a high hole-transport property. Examples of the substance having a high hole-transport property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances mentioned here are mainly ones that have a hole mobility of $10^{-6}$ cm$^2$/Vs or higher. Note that another substance may be used instead of these substances as long as the substance has a hole-transport property higher than an electron-transport property. The layer containing a substance having a high hole-transport property is not limited to a single layer, and may be a stack of two or more layers containing the substances given above.

Alternatively, a high molecular compound such as poly(N-vinylcarbazole) (abbreviation: PVK) or poly(4-vinyltriphenylamine) (abbreviation: PVTPA) can be used for the hole-transport layer 702.

The light-emitting layer 703 is a layer which contains a light-emitting substance. The light-emitting layer 703 may be either a light-emitting layer of a single film containing an emission center material as its main component or a so-called host-guest type light-emitting layer in which an emission center material is dispersed in a host material.

There is no particular limitation on the emission center material that is used, and a known fluorescent material or a known phosphorescent material can be used. As a fluorescent material, for example, in addition to N,N'-bis[4-(9H-carbazol-9-yl)phenyl]-N,N'-diphenylstilbene-4,4'-diamine (abbreviation: YGA2S), and 4-(9H-carbazol-9-yl)-4'-(10-phenyl-9-anthryl)triphenylamine (abbreviation: YGAPA), there are fluorescent materials with an emission wavelength of greater than or equal to 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N"-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N"-triphenyl-1,4-phenylenediamine (abbreviation: 2DPAPPA), N,N,N',N',N",N", N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As phosphorescent materials, for example, in addition to bis[2-(4',6'-difluorophenyl)pyridinato-N,C$^{2'}$]iridium(III)tetrakis (1-pyrazolyl)borate (abbreviation: FIr6), there are phosphorescent materials with an emission wavelength in the range of 470 nm to 500 nm, such as bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), and bis[2-(4',6'-difluorophenyl)pyridinato-N,$C^{2'}$]iridium(III) acetylacetonate (abbreviation: FIracac); phosphorescent materials with an emission wavelength of greater than or equal to 500 nm (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), bis[2-(2'-benzo[4,5-a]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (2,3,7,8,12,13,17,18-octaethyl-21H,23H-porphine)platinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)); and the like. The light-emitting substances can be selected from the above-mentioned materials or other known materials in consideration of the emission color of each of the light-emitting elements.

When the host material is used, for example, the following are given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compounds include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3). From these materials or other known materials, a material may be selected which has a larger energy gap (or a triplet energy if the material emits phosphorescence) than an emission center material dispersed in the material and which has a transport property as needed.

The electron-transport layer 704 is a layer which contains a substance having a high electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) is used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. Note that another substance may be used for the electron-transport layer 704 as long as the substance has a higher electron-transport property than a hole-transport property.

Further, the electron-transport layer 704 is not limited to a single layer and may be a stack of two or more layers containing the substances given above.

Further, a layer for controlling transport of electron carriers may be provided between the electron-transport layer 704 and the light-emitting layer 703. Specifically, the layer for controlling transport of electron carriers is a layer formed by adding a small amount of substance having a high electron trapping property to the above-described material having a high electron-transport property, and can adjust carrier balance by suppressing transport of electron carriers. Such a structure is very effective in suppressing problems (e.g., reduction in element lifetime) caused by a phenomenon in which an electron passes through the light-emitting layer 703.

For the electron-injection layer 705, an alkali metal, an alkaline earth metal, or a compound thereof, such as lithium fluoride (LiF), cesium fluoride (CsF), or calcium fluoride (CaF$_2$), can be used. Alternatively, a material in which a layer formed using an electron-transport substance contains a substance exhibiting an acceptor property (typically, an alkali metal, an alkaline earth metal, or a compound thereof) with respect to the electron-transport substance (the material having a donor level), for example, a material in which Alq contains magnesium (Mg) can be used for the electron-injection layer 705. Note that use of the material having a donor level for the electron-injection layer 705 is preferred because electron injection from the second transparent electrode 106 is effectively performed.

In the case of using the second transparent electrode 106 as a cathode, metal, an alloy, an electrically conductive compound, a mixture thereof, or the like having a low work function (specifically, 3.8 eV or lower) can be used as a substance for the second transparent electrode 106. As a specific example of such a cathode material, an element belonging to Group 1 or 2 of the periodic table, that is, an alkali metal such as lithium (Li) or cesium (Cs); an alkaline earth metal such as magnesium (Mg), calcium (Ca), or strontium (Sr); an alloy containing any of these (e.g., MgAg or AlLi); a rare earth metal such as europium (Eu) or ytterbium (Yb); an alloy containing such a rare earth metal; and the like are given. Note that when the electron-injection layer 705 is provided between the cathode and the electron-transport layer 704, the cathode can be formed using a variety of conductive materials such as Al, Ag, ITO, or indium tin oxide containing silicon or silicon oxide, regardless of its work function. These conductive materials can be deposited by a sputtering method, a vacuum evaporation method, or the like. Note that in the light-emitting device in this embodiment, light is extracted from the second transparent electrode 106 direction; therefore, the second transparent electrode 106 needs to have a light-transmitting property. When a material whose light-transmitting property is small among the above-described materials is used for the second transparent electrode, the thickness is set so as to transmit light. The second transparent electrode 106 may be a stack of a material layer with such a thickness and a conductive material having a light-transmitting property such as ITO.

In the case of using the second transparent electrode 106 as an anode, metal, an alloy, a conductive compound, a mixture thereof, or the like having a high work function (specifically, 4.0 eV or higher) is preferably used. Specifically, for example, indium tin oxide (ITO), indium tin oxide containing silicon or silicon oxide, indium zinc oxide, indium oxide containing tungsten oxide and zinc oxide (IWZO), or the like is given. Films of these conductive metal oxides are usually formed by sputtering; however, a sol-gel method or the like may also be used. For example, indium zinc oxide can be formed by a sputtering method using a target in which zinc oxide is added to indium oxide at 1 wt % to 20 wt %. Moreover, indium oxide containing tungsten oxide and zinc oxide (IWZO) can be formed by a sputtering method using a target in which tungsten oxide is added to indium oxide at 0.5 wt % to 5 wt % and zinc oxide is added to indium oxide at 0.1 wt % to 1 wt %.

In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like is given. In the case of using any of these metals and elements whose light-transmitting property is small, the thickness thereof is set so as to transmit light. The second transparent electrode 106 may be a stack of a material layer with such a thickness and a light-transmitting conductive material having a light-transmitting property such as ITO.

When the above-mentioned composite material is formed to be in contact with the anode, a material for the electrode can be selected regardless of its work function.

Although the second transparent electrode 106 may be formed entirely over the light-emitting surface as in FIGS. 1A and 1B, the second transparent electrode 106 may be formed to have a non-formation portion 106a in a portion that overlaps with the through hole 122 as in FIGS. 7A and 7B or FIGS. 8A and 8B. In a light-emitting device and a lighting device with such a structure, even when the EL layer 105 does not cover sufficiently a step by the through hole 122 through which the first transparent electrode 104 is in contact with the reflective electrode 102, the second transparent electrode 106 is not contact with the first transparent electrode 104, so that occurrence of a short circuit can be prevented, leading to a light-emitting device and a lighting device with high reliability. The second transparent electrode 106 with the non-formation portion 106a can be formed in a portion except the non-formation portion 106a, using a shadow mask in the case of employing a deposition method such as an evaporation method, a sputtering method, or a CVD method, or by a printing method in the case where the material of the second transparent electrode 106 can be deposited by the printing method. Alternatively, the second transparent electrode 106 is formed entirely over the light-emitting surface, and then etching is performed on a portion corresponding to the non-formation portion 106a by a photolithography method.

Figure 9A:
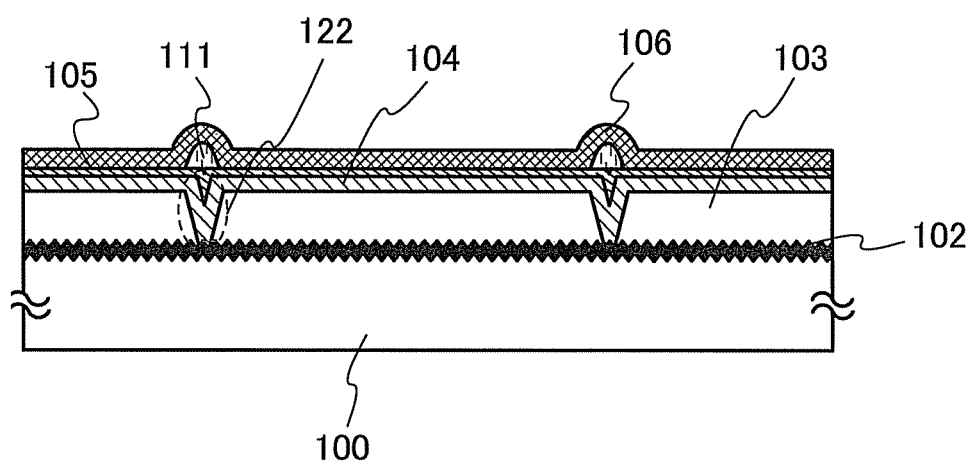
FIGS. 9A and 9B are views illustrating a light-emitting device which is one embodiment of the present invention.
Figure 9B:
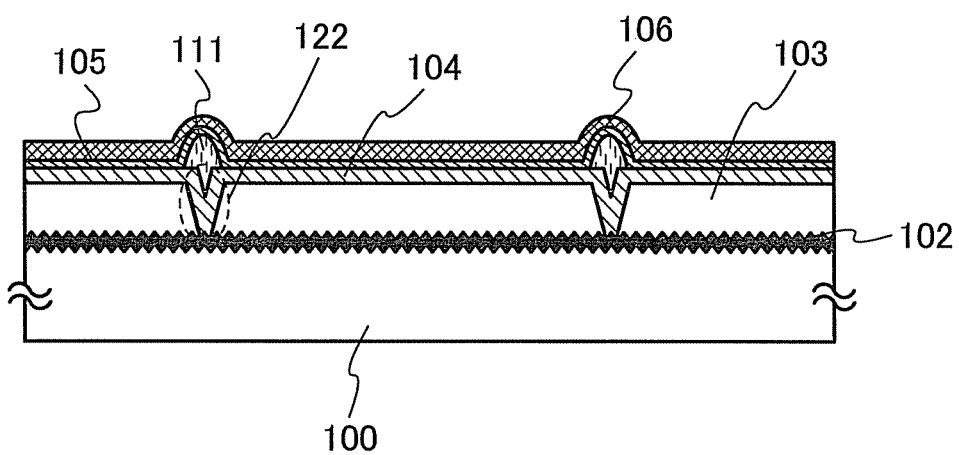

With a structure in which an insulating film 111 is formed over a portion corresponding to the through hole 122 as in FIGS. 9A and 9B, a short circuit can be prevented, which leads to a light-emitting device and a lighting device with high reliability. There is no particular limitation on the insulating film 111, and the insulating film 111 may be an organic insulating film, an inorganic insulating film, or the like. The insulating film 111 may be formed using a known material by a known method.

Figure 14A:
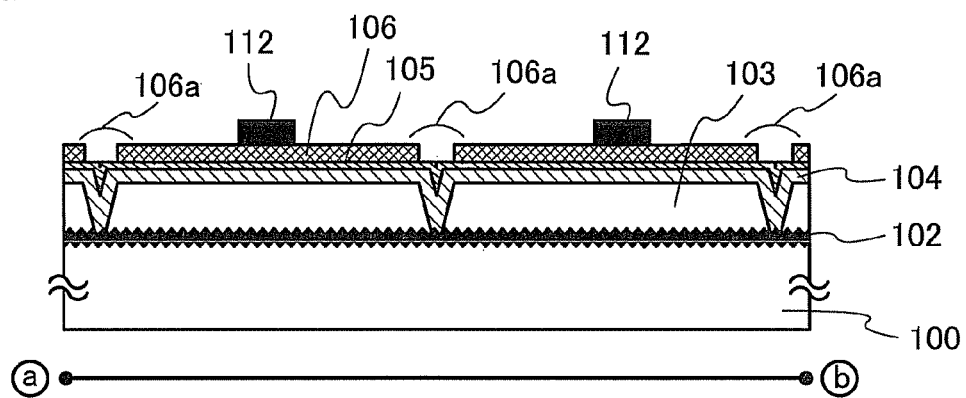
FIGS. 14A and 14B are views illustrating a light-emitting device which is one embodiment of the present invention.
Figure 14B:
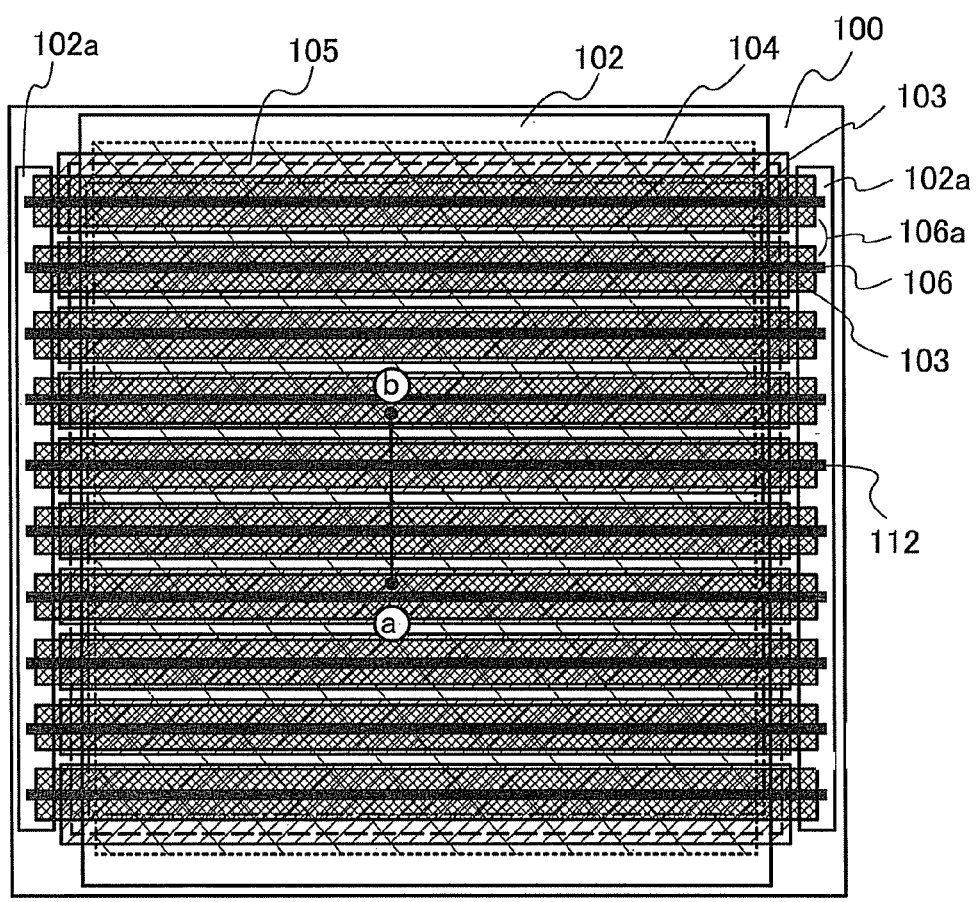

Further, an auxiliary wiring 112 may be formed over the second transparent electrode 106 as in FIGS. 14A and 14B. In that case, the auxiliary wiring 112 is preferably formed using a material with high conductivity. Further, in the case where the second transparent electrode 106 is provided with the non-formation portion 106a and divided into island-shaped second transparent electrodes as in FIGS. 14A and 14B, one island-shaped second transparent electrode is preferably connected to at least one auxiliary wiring 112. Although FIGS. 14A and 14B illustrate an example where the auxiliary wiring 112 is formed over the second transparent electrode 106 with the non-formation portion 106a, the auxiliary wiring 112 can be formed similarly in the case where the second transparent electrode 106 is formed entirely over the light-emitting surface as in FIGS. 1A and 1B and FIGS. 6A and 6B and in the case where the non-formation portions 106a are dispersed as in FIGS. 8A and 8B.

Figure 16:
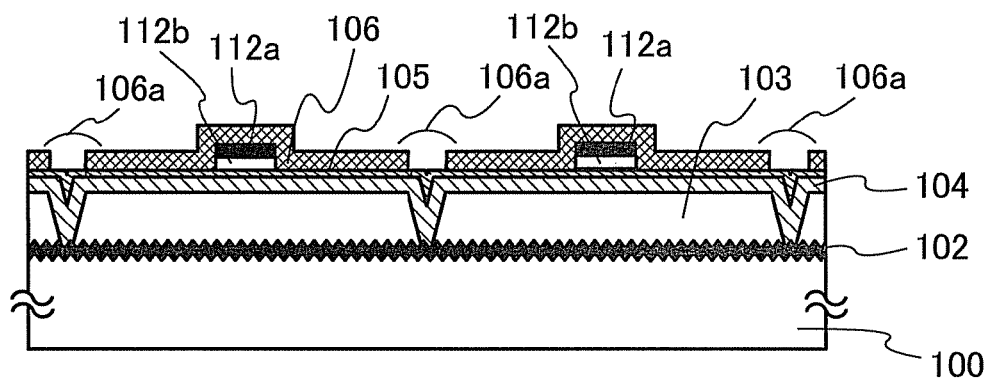
FIG. 16 is a view illustrating a light-emitting device which is one embodiment of the present invention.

Alternatively, as in FIG. 16, an auxiliary wiring 112a may be provided under the second transparent electrode 106. The formation of the auxiliary wiring 112a is performed in accordance with that of the auxiliary wiring 112 in FIGS. 14A and 14B. Note that although the auxiliary wiring 112a may be in contact with the EL layer 105, it is difficult to extract light from a portion between the auxiliary wiring 112a and the reflective electrode 102; therefore, an insulating film 112b is preferably provided between the auxiliary wiring 112a and the EL layer 105. The provision of the insulating film 112b can prevent light emission that cannot be extracted easily from occurring, so that the emission efficiency can be improved.

The shapes of the auxiliary wiring 112 and the auxiliary wiring 112a and the intervals thereof may be determined as appropriate so as to achieve a desired light-emitting quality, depending on the electric resistance of the second transparent electrode 106.

Figure 3:
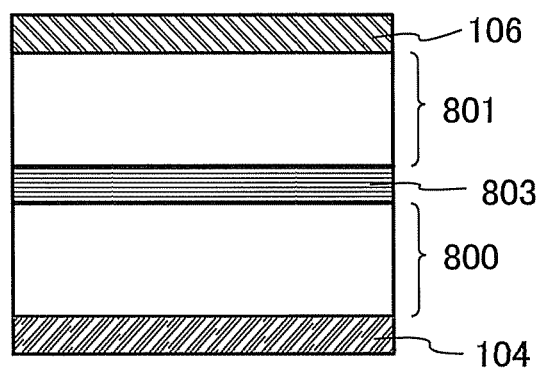
FIG. 3 is a diagram illustrating a structural example of an EL layer applicable to the present invention.

Note that the EL layer 105 may have a structure in which a plurality of light-emitting units is stacked between the first transparent electrode 104 and the second transparent electrode 106 as illustrated in FIG. 3. In that case, a charge-generation layer 803 is preferably provided between a first light-emitting unit 800 and a second light-emitting unit 801 which are stacked. The charge-generation layer 803 can be formed using the above-mentioned composite material. Further, the charge-generation layer 803 may have a stacked structure of a layer formed using the composite material and a layer formed using another material. In that case, as the layer formed using another material, a layer containing an electron donating substance and a substance having a high electron-transport property, a layer formed of a transparent conductive film, or the like can be used. A light-emitting element having such a structure does not easily involve problems such as energy transfer between the light-emitting units and quenching and has more choices of materials, thereby readily having both high emission efficiency and a long lifetime. It is also easy for such a light-emitting element to exhibit phosphorescence from one of the light-emitting units and fluorescence from the other of the light-emitting units. Although FIG. 3 illustrates a structure in which two light-emitting units (the first light-emitting unit 800 and the second light-emitting unit 801) are stacked, three or more light-emitting units can be stacked. In such a case, charge-generation layers are preferably provided between the light-emitting units.

The light-emitting unit has a structure similar to the structure of the EL layer 105 in FIG. 2, and may be foamed by combining functional layers described as components of the EL layer in FIG. 2 as appropriate, such as a light-emitting layer, an electron-transport layer containing a substance having a high electron-transport property, a hole-transport layer containing a substance having a high hole-transport property, an electron-injection layer containing a substance having a high electron-injection property, a hole-injection layer containing a substance having a high hole-injection property, and a bipolar layer containing a substance having a bipolar property (a substance having a high electron-transport property and a high hole-transport property). These functional layers other than the light-emitting layer are not necessarily provided and another functional layer may be provided.

The detailed explanation of these layers is given above and a repeated explanation thereof is omitted. Refer to the description of the EL layer 105 in FIG. 2.

The structure illustrated in FIG. 3 is preferable for obtaining white light emission, and thus suitable particularly for lighting application. A high-quality light-emitting device and a high-quality lighting device can be obtained by combining the structures illustrated in FIGS. 1A and 1B and FIG. 2 with the structure illustrated in FIG. 3.

Next, a method for manufacturing the light-emitting device and the lighting device is described with reference to FIGS. 4A to 4C and FIGS. 5A to 5C. Note that a material, a structure, and a detailed manufacturing method are given above; thus, repeated description is omitted.

Figure 4A:
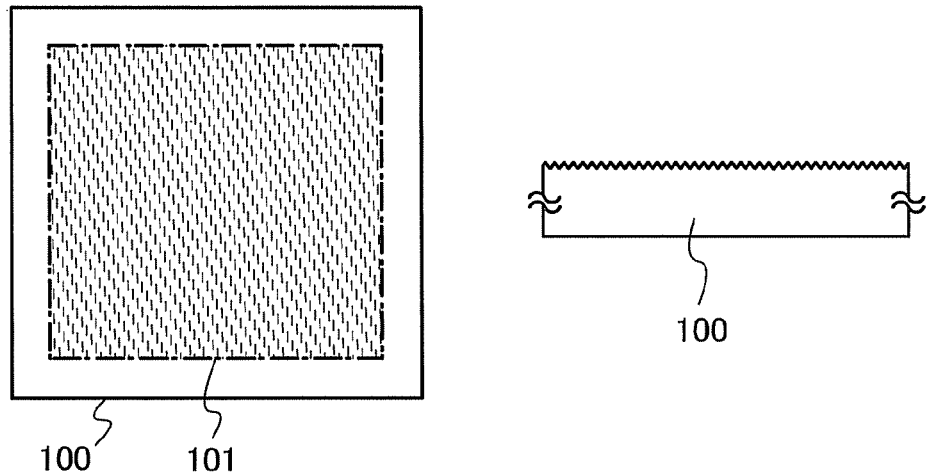
FIGS. 4A to 4C are views illustrating a manufacturing method of a light-emitting device which is one embodiment of the present invention.
Figure 4B:
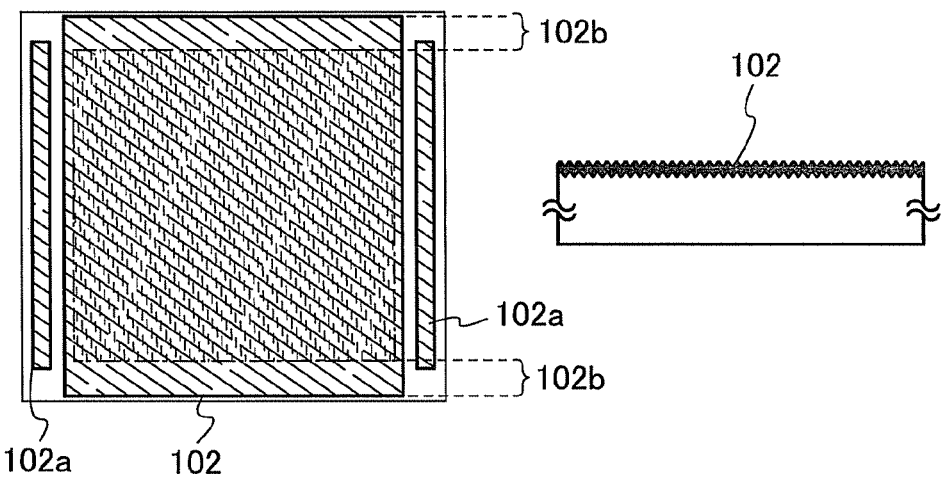
Figure 4C:
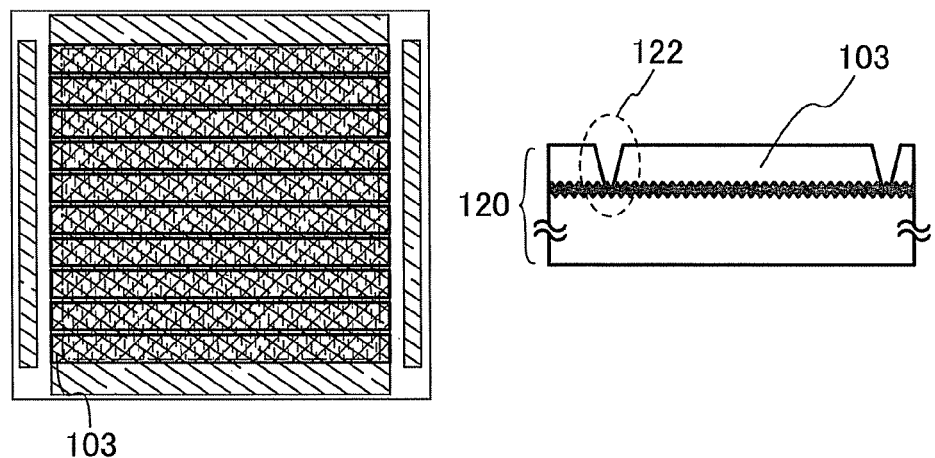

First, the support 100 with an uneven structure portion 101 is prepared (FIG. 4A). Next, the reflective electrode 102 is formed over the support 100 to cover the uneven structure portion 101 (FIG. 4B). In FIGS. 4A to 4C, the external input terminal 102a is formed simultaneously with the reflective electrode 102. In addition, a portion which is continuous with the reflective electrode 102 and located between the uneven structure portion 101 and the periphery of the support 100 can be used as the external input terminal 102b. After that, the planarization film 103 is formed over the reflective electrode 102 (FIG. 4C). The through hole 122 is formed in the planarization film 103 so that the reflective electrode 102 is exposed. There is no particular limitation on the shape of the through hole 122. The shape of the through hole 122 may be a slit shape as in FIG. 4C such that the planarization film 103 is divided into a plurality of island-shaped planarization films, a grid shape, a dot shape, or a spiral shape. The width of the through hole 122 and the interval thereof may be determined as appropriate in accordance with the electric resistance of the first transparent electrode 104 which is formed later.

Through the above steps, the reflection member 120 can be formed.

Figure 5A:
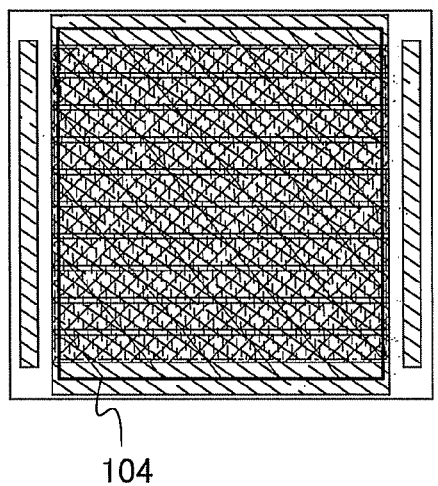
FIGS. 5A to 5C are views illustrating the manufacturing method of the light-emitting device which is one embodiment of the present invention.
Figure 5A:
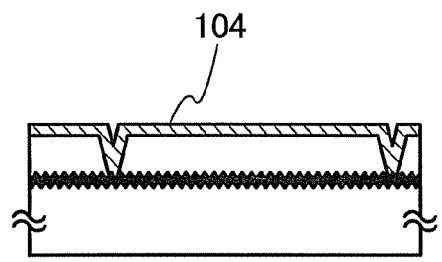

The first transparent electrode 104 is formed over the reflection member 120 (FIG. 5A). The first transparent electrode 104 is electrically or directly connected to the reflective electrode 102 through the through hole 122. This compensates the electric resistance of the first transparent electrode 104, so that a light-emitting device or a lighting device in which luminance unevenness of the light-emitting surface is reduced can be provided.

Figure 5B:
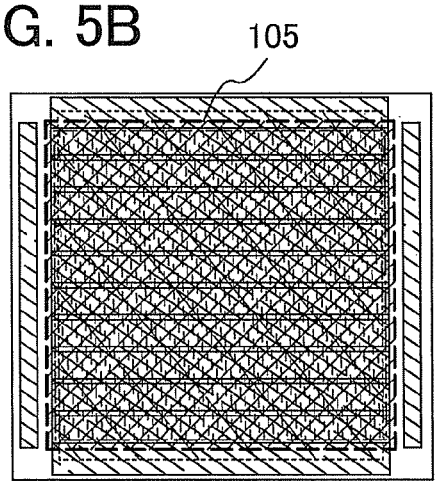
Figure 5B:
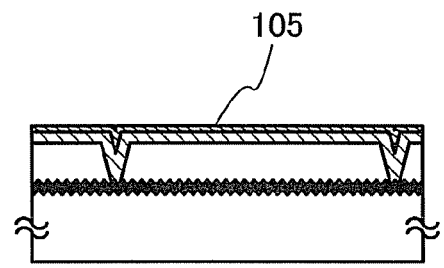

Next, the EL layer 105 is formed (FIG. 5B). The EL layer 105 may have any known structure.

Figure 5C:
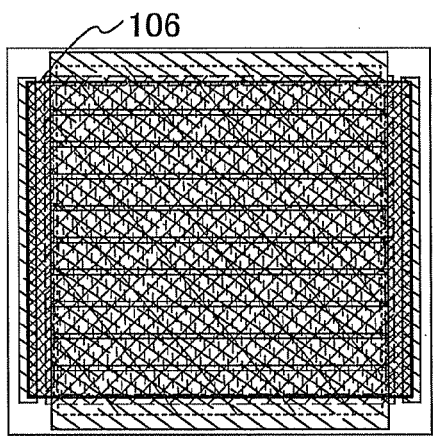
Figure 5C:
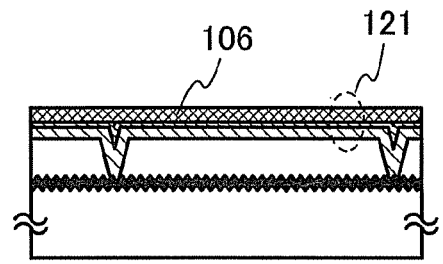

Then, the second transparent electrode 106 is formed, and thus the light-emitting element 121 is completed (FIG. 5C). The second transparent electrode 106 is formed to extend to the region of the external input terminal 102a, so that the second transparent electrode 106 can be connected to an external signal.

Figure 13A:
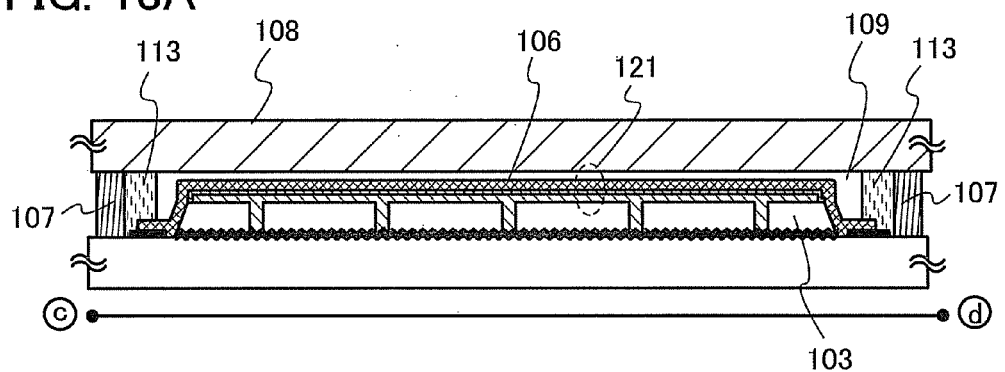
FIGS. 13A and 13B are views illustrating a light-emitting module which is one embodiment of the present invention.
Figure 13B:
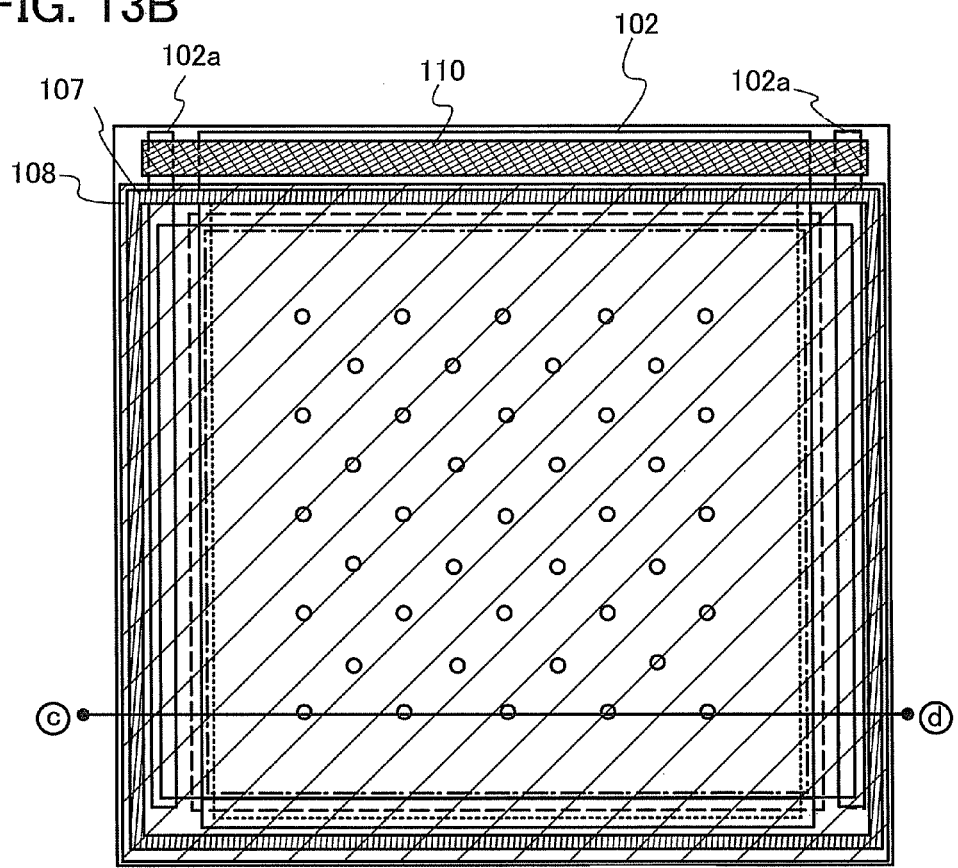

FIGS. 13A and 13B illustrate an example of a sealing structure and an example of a module. The light-emitting element 121 formed over the reflection member 120 is shielded from the outside atmosphere by attaching the reflection member 120 to the transparent sealing member 108 with a sealing material 107. A desiccant 113 is provided in a region surround by the sealing material, so that the adversely effect by water entering from the outside atmosphere can be reduced, leading to an increase in reliability. A filler may be put in a space 109 surround by the sealing material 107 (the desiccant 113), the reflection member 120, and the sealing member 108. The light extraction efficiency can be improved and the sealing measures can be enhanced depending on the selection of the filler.

FIG. 13B illustrates an example where a converter 110 is provided over the reflection member 120. The converter 110 may be modularized in this manner or may be mounted on the external device. Such a modularization enables an external device to be simplified or shared with another light-emitting device or another lighting device, which is preferable in terms of widespread use of the light-emitting device or the lighting device.

Embodiment 2

In this embodiment, a lighting device in which a light-emitting device manufactured according to one embodiment of the present invention is used is described with reference to FIGS. 15A and 15B.

Figure 15A:
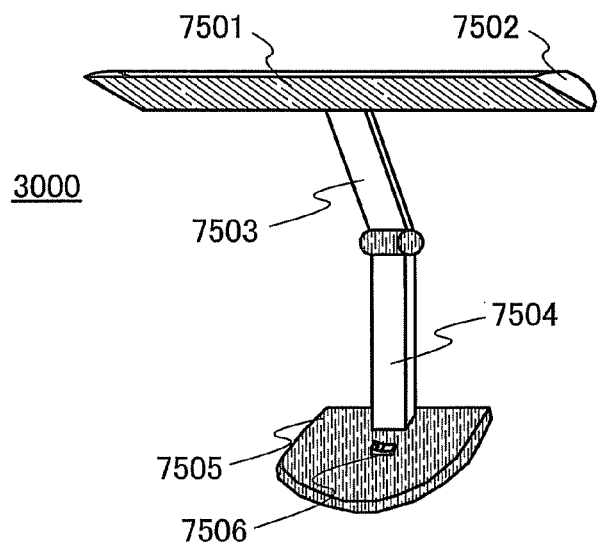
FIGS. 15A and 15B are views illustrating lighting devices including light-emitting devices which are each one embodiment of the present invention.

FIG. 15A illustrates a lighting device (a desk lamp 3000), which includes a lighting portion 7501, a shade 7502, an adjustable arm 7503, a support 7504, a base 7505, and a power switch 7506. Note that the lighting device is manufactured by using a light-emitting device, which is manufactured according to one embodiment of the present invention, for the lighting portion 7501. The lighting device includes, in its category, ceiling lights (ceiling-fixed lighting devices), wall lights (wall-hanging lighting devices), and the like in addition to the desk lamp illustrated in FIG. 15A.

Note that a light-emitting device manufactured according to one embodiment of the present invention is a light-emitting device with low capital-investment spending for quantity production, in which short circuit due to a step of an auxiliary electrode is suppressed, power loss is reduced, and luminance in a light-emitting surface is uniform. Therefore, by using the light-emitting device for the lighting portion 7501 in the lighting device (the desk lamp 3000), the lighting device (the desk lamp) with high reliability, less power consumption, and high quality can be provided inexpensively.

Figure 15B:
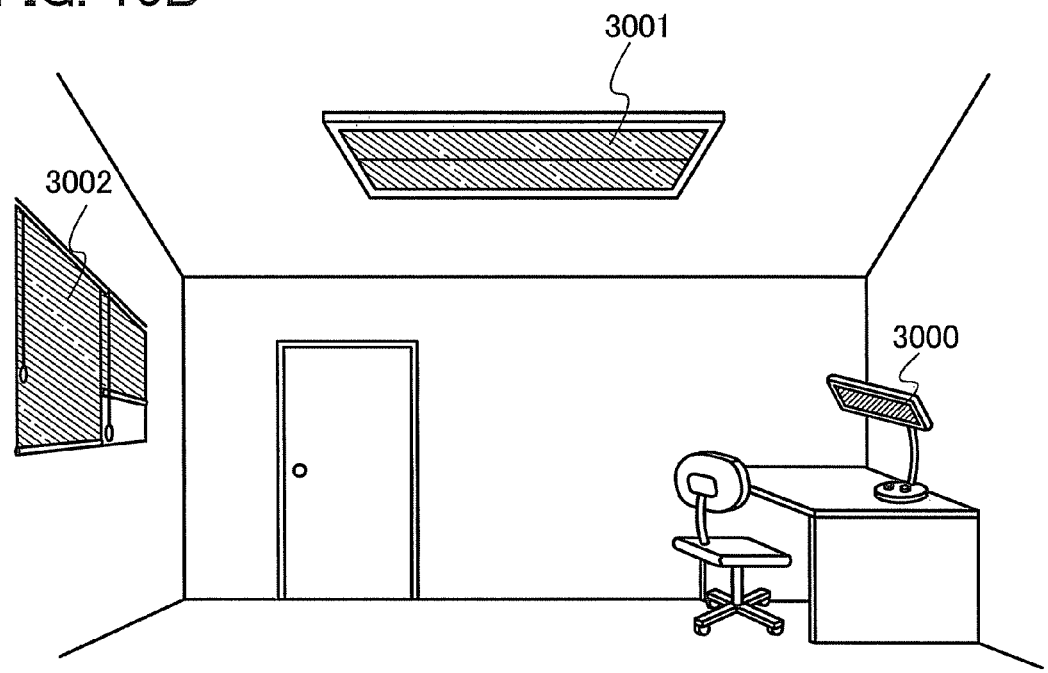

FIG. 15B illustrates an example in which a light-emitting device manufactured according to one embodiment of the present invention is used for an interior lighting device. The light-emitting device which is one embodiment of the present invention is advantageous in increasing the area because it includes an auxiliary electrode, and thus can be used for a lighting device having a large area like a ceiling-fixed lighting device 3001. In addition, the light-emitting device can be used for a wall-hanging lighting device 3002. Note that a light-emitting device or a lighting device manufactured according to one embodiment of the present invention is a light-emitting device or a lighting device that can be manufactured to have less variation in luminance of a light-emitting surface and preferable emission efficiency without great increase in cost.

This application is based on Japanese Patent Application serial no. 2010-287387 filed with Japan Patent Office on Dec. 24, 2010, the entire contents of which are hereby incorporated by reference.

What is claimed is:

1. A light-emitting device comprising:
  a reflection member, the reflection member comprising:
    a reflective electrode having projections; and
    a planarization film covering the reflective electrode,
  a sealing member having a light-transmitting property; and
  a light-emitting element between the reflection member and the sealing member, the light-emitting element comprising an EL layer between a first transparent electrode and a second transparent electrode,
  wherein an electric resistance of the reflective electrode is lower than an electric resistance of the first transparent electrode, and
  wherein the reflective electrode is electrically connected to the first transparent electrode.

2. The light-emitting device according to claim 1, wherein the reflective electrode is electrically connected to the first transparent electrode through a through hole formed in the planarization film.

3. The light-emitting device according to claim 2, further comprising an insulating layer overlapping the through hole,
  wherein the insulating layer is formed between the second transparent electrode and the EL layer.

4. The light-emitting device according to claim 2, further comprising an insulating layer overlapping the through hole,
  wherein the insulating layer is foamed between the first transparent electrode and the EL layer.

5. The light-emitting device according to claim 2, further comprising an opening provided in the second transparent electrode,
  wherein the opening overlaps with the through hole.

6. The light-emitting device according to claim 1, wherein the planarization film comprises a conductive organic resin.

7. The light-emitting device according to claim 1, wherein a refractive index of the planarization film is 1.6 to 2.0.

8. The light-emitting device according to claim 1, further comprising an insulating substrate having projections,
  wherein a shape of the projections of the reflective electrode is in accordance with a shape of the projections of the insulating substrate.

9. The light-emitting device according to claim 1, further comprising an insulating substrate,
  wherein the insulating substrate is flat.

10. The light-emitting device according to claim 1, further comprising a conductive substrate.

11. The light-emitting device according to claim 1, wherein a material comprised in the reflective electrode is a metal selected from silver, aluminum, gold, nickel, platinum, tin, copper, magnesium, and palladium; a compound comprising the metal; an alloy comprising the metal; or a stainless steel comprising the metal.

12. The light-emitting device according to claim 1,
  wherein an average height Rc of each of the projections of the reflection member is greater than or equal to 0.01 µm and less than or equal to 100 µm, and
  wherein a distance between tops of adjacent projections of the projections is greater than or equal to 0.1 µm and less than or equal to 100 µm.

13. A lighting device comprising the light-emitting device according to claim 1.

14. A light-emitting device comprising:
  a reflective electrode having a plurality of projections;
  a planarization film having a through hole over the reflective electrode;
  a first electrode over the planarization film;
  an EL layer over the first electrode; and
  a second electrode over the EL layer,
  wherein the first electrode is electrically connected to the reflective electrode through the through hole.

15. The light-emitting device according to claim 14, further comprising an insulating layer overlapping the through hole,
  wherein the insulating layer is formed between the second electrode and the EL layer.

16. The light-emitting device according to claim 14, further comprising an insulating layer overlapping the through hole,
  wherein the insulating layer is formed between the first electrode and the EL layer.

17. The light-emitting device according to claim 14, further comprising an opening provided in the second electrode,
  wherein the opening overlaps with the through hole.

18. The light-emitting device according to claim 14, wherein the planarization film comprises a conductive organic resin.

19. The light-emitting device according to claim 14, wherein a refractive index of the planarization film is 1.6 to 2.0.

20. The light-emitting device according to claim 14, further comprising an insulating substrate having a plurality of projections,
  wherein a shape of the plurality of projections of the reflective electrode is in accordance with a shape of the plurality of projections of the insulating substrate.

21. The light-emitting device according to claim 14, further comprising an insulating substrate,
  wherein the insulating substrate is flat.

22. The light-emitting device according to claim 14, further comprising a conductive substrate.

23. The light-emitting device according to claim 14, wherein a material comprised in the reflective electrode is a metal selected from silver, aluminum, gold, nickel, platinum, tin, copper, magnesium, and palladium; a compound comprising the metal; an alloy comprising the metal; or a stainless steel comprising the metal.

24. The light-emitting device according to claim 14,
wherein an average height Rc of the plurality of projections of the reflective electrode is greater than or equal to 0.01 μm and less than or equal to 100 μm, and
wherein a distance between tops of adjacent projections of the projections is greater than or equal to 0.1 μm and less than or equal to 100 μm.

25. A lighting device comprising the light-emitting device according to claim 14.

26. The light-emitting device according to claim 14, wherein each of the plurality of projections has a pyramid shape.

* * * * *

UNITED STATES PATENT AND TRADEMARK OFFICE
CERTIFICATE OF CORRECTION

PATENT NO. : 8,586,974 B2  
APPLICATION NO. : 13/331406  
DATED : November 19, 2013  
INVENTOR(S) : Shunpei Yamazaki, Hisao Ikeda and Tomoe Matsubara Page 1 of 1

It is certified that error appears in the above-identified patent and that said Letters Patent is hereby corrected as shown below:

In the Specification:

Column 2, line 5; Change "In viewing of" to --In view of--.
Column 7, line 48; Change "material with, a" to --material with a--.
Column 7, line 62; Change "screen printing; or" to --screen printing, or--.
Column 11, line 39; Change "poly[N,N-bis" to --poly [N,N'-bis--.
Column 11, line 40; Change ")-N,N-bis(phenyl)" to --)-N,N'-bis(phenyl)--.
Column 11, line 54; Change "[1,1-biphenyl]" to --[1,1'-biphenyl]--.
Column 17, line 33; Change "be foamed by" to --be formed by--.

In the Claims:

Column 19, line 60, Claim 4; Change "is foamed between" to --is formed between--.

Signed and Sealed this  
Twenty-fifth Day of March, 2014

Michelle K. Lee  
*Deputy Director of the United States Patent and Trademark Office*